United States Patent
Nicholls et al.

(10) Patent No.: US 9,647,672 B2
(45) Date of Patent: May 9, 2017

(54) DIGITALLY COMPENSATED PHASE LOCKED OSCILLATOR

(71) Applicant: NANOWAVE TECHNOLOGIES INC., Etobicoke (CA)

(72) Inventors: Charles William Tremlett Nicholls, Ottawa (CA); Walid Hamdane, Ottawa (CA)

(73) Assignee: NANOWAVE TECHNOLOGIES INC., Etobicoke (CA)

( * ) Notice: Subject to any disclaimer, the term of this patent is extended or adjusted under 35 U.S.C. 154(b) by 0 days.

(21) Appl. No.: 15/038,891

(22) PCT Filed: Nov. 25, 2013

(86) PCT No.: PCT/CA2013/050901
§ 371 (c)(1),
(2) Date: May 24, 2016

(87) PCT Pub. No.: WO2015/074133
PCT Pub. Date: May 28, 2015

(65) Prior Publication Data
US 2016/0365865 A1    Dec. 15, 2016

(51) Int. Cl.
H03L 7/085    (2006.01)
H03L 7/099    (2006.01)
H03L 1/02     (2006.01)
H03L 7/16     (2006.01)

(52) U.S. Cl.
CPC .......... *H03L 7/0991* (2013.01); *H03L 1/026* (2013.01); *H03L 7/16* (2013.01)

(58) Field of Classification Search
CPC ........ H03L 1/026; H03L 7/16; H03L 7/0991; H03L 7/08

USPC ..... 331/176, 1, 18 A, 1 A, 18; 327/156, 159
See application file for complete search history.

(56) References Cited

U.S. PATENT DOCUMENTS

2007/0182467 A1   8/2007  Nakamuta
2010/0315137 A1*  12/2010 Kimura ................ H03L 7/08
                                                  327/156

OTHER PUBLICATIONS

International Patent Application No. PCT/CA2013/050901, ISR dated Jul. 24, 2014.
International Patent Application No. PCT/CA2013/050901, IPRP dated Feb. 10, 2016.

* cited by examiner

*Primary Examiner* — Arnold Kinkead
(74) *Attorney, Agent, or Firm* — Borden Ladner Gervais LLP; Curtis B. Behmann (57) ABSTRACT

A digitally compensated phase locked oscillator (DCPLO) is disclosed herein. The DCPLO comprises: a DCPLO input for receiving a reference signal at a known frequency; a DCPLO output for outputting a signal at a desired frequency; a phased locked loop (PLL), the phased locked loop comprising: a phase frequency detector, an oscillator, and a PLL output coupled to the output; a first direct digital synthesizer (DDS), the first DDS having an output coupled to the PLL to supply a DDS signal to the PLL for adjusting the frequency within the PLL so as to maintain phase lock over the operating temperature; a temperature sensor; and a processor coupled to the first DDS, the phase frequency detector, and the temperature sensor, the processor configured to set the frequency of the first DDS according to a temperature sensed by the temperature sensor.

16 Claims, 7 Drawing Sheets

DIGITALLY COMPENSATED PHASE LOCKED OSCILLATOR

FIELD

The present disclosure relates generally to digitally compensated phase locked oscillator systems and methods.

BACKGROUND

Radio systems consist of reception and transmission equipment. A fundamental requirement of such equipment is to instantiate information on the radio transmission signal, in the case of the transmitter and to recover the information in the case of the receiver. Frequency conversion between the information signal and the radio frequency channel is achieved through a process of frequency conversion in which a stable local oscillator signal operating at the frequency of the radio channel is used to convert the information signal between the information channel and the radio channel.

The above information is presented as background information only to assist with an understanding of the present disclosure. No determination has been made, and no assertion is made, as to whether any of the above might be applicable as prior art with regard to the present invention.

SUMMARY

In a first aspect, the present disclosure provides a digitally compensated phase locked oscillator (DCPLO), comprising: a DCPLO input for receiving a reference signal at a known frequency; a DCPLO output for outputting a signal at a desired frequency; a phased locked loop (PLL), the phased locked loop comprising: a phase frequency detector; an oscillator; a PLL output coupled to the output; a first direct digital synthesizer (DDS), the first DDS having an output coupled to the PLL to supply a DDS signal to the PLL for adjusting a frequency within the PLL; a temperature sensor; and a processor coupled to the first DDS, the phase frequency detector, and the temperature sensor, the processor configured to set the frequency of the first DDS according to a temperature sensed by the temperature sensor so as to maintain the PLL in a phase locked state.

In some embodiments, the digitally compensated phase locked oscillator further comprises: a storage medium coupled to processor, the storage medium storing a plurality of first DDS frequencies and associated temperature values; wherein the processor is configured to set the frequency of the first DDS by: determining the temperature sensed by the temperature sensor; identifying a temperature value stored in the storage medium closest to the sensed temperature; identifying a first DDS frequency stored in the storage medium associated with the identified temperature; and operating the first DDS at the identified frequency.

In various embodiments, the digitally compensated phase locked oscillator further comprises a frequency compensation circuit coupled to an output of the PLL, the frequency compensation circuit comprising: a second DDS having an input coupled to the processor; a mixer, for mixing an output of the second DDS and the output of the PLL to produce a mixed signal; and a bandpass filter coupled to an output of the mixer for selecting a sideband of the mixed signal. In some embodiments, the processor is further configured to set the frequency of the second DDS to produce a mixed signal having a desired frequency.

In various embodiments, the phased locked loop comprises: an image rejection mixer coupled between the oscillator and the phase frequency detector; and a power splitter (PS) having an input coupled to an output of the image rejection mixer, a first PS output coupled to the phase frequency detector and a second PS output coupled to the DCPLO output; the first DDS comprises a dual channel DDS having two outputs in quadrature for driving an IF port of the image rejection mixer.

In some embodiments, the digitally compensated phase locked oscillator further comprises: a frequency compensation circuit coupled to an output of the PLL, the frequency compensation circuit comprising: a second DDS having an input coupled to the processor; a mixer, for mixing an output of the second DDS and the output of the PLL to produce a mixed signal; and a bandpass filter coupled to an output of the mixer for selecting a sideband of the mixed signal. In various embodiments, the processor is further configured to set the frequency of the second DDS to produce a mixed signal having a desired frequency.

In some embodiments, the phased locked loop further comprises: an image rejection mixer coupled between the oscillator and the phase frequency detector; and a power splitter (PS) having an input coupled to an output of the image rejection mixer, a first PS output coupled to the phase frequency detector and a second PS output coupled to the DCPLO output. In various embodiments, the DCPLO further comprises a 90 degree hybrid coupler coupled between the output of the first DDS and an IF port of the image rejection mixer.

In another aspect, the present disclosure provides a method of calibrating the digitally compensated phase locked oscillator, the method comprising: a. setting the temperature to a first temperature; b. loading a minimum operating temperature, a maximum operating temperature, and an output frequency from the storage medium; c. measuring a temperature associated with the DCPLO; d. sweeping the frequency of the first DDS across a frequency range; e. recording each frequency of the first DDS at which the PLL is locked against the measured temperature; f. after completing the sweep, calculating a mid frequency of the first DDS based on each of the recorded frequencies; and g. storing the mid frequency and the recorded temperature in a look up table.

In some embodiments, the method further comprises: h. setting the temperature to a second temperature; and repeating b to g for the second temperature.

Other aspects and features of the present disclosure will become apparent to those ordinarily skilled in the art upon review of the following description of specific embodiments in conjunction with the accompanying figures.

BRIEF DESCRIPTION OF THE DRAWINGS

Embodiments of the present disclosure will now be described, by way of example only, with reference to the attached Figures.

DETAILED DESCRIPTION

For simplicity and clarity of illustration, reference numerals may be repeated among the figures to indicate corresponding or analogous elements. Numerous details are set forth to provide an understanding of the embodiments described herein.

The example embodiments may be practiced without these details. In other instances, well-known methods, procedures, and components have not been described in detail to avoid obscuring the embodiments described. The description is not to be considered as limited to the scope of the example embodiments described herein.

Two common applications of radio systems are: RADAR and radio communications. In case of a RADAR system the information is instantiated on a transmitted radio frequency pulse by the target whereas in a radio communication apparatus information is instantiated by the radio transmission device itself. In both RADAR and radio communication systems noise present in the stable local oscillator causes decreases in the signal to noise power ratio making the reception system less sensitive to the information signal. A point is reached where the noise present in the transmission and reception apparatus relative to the information signal power causes the signal not to be received. In the case of a radio communication system increased system noise results in a failure of the system to accurately transmit and receive information. In the case of RADAR increased in system noise result in a reduction in the target detection range. It is consequently advantageous for radio communication and RADAR systems apparatus to generate very little intrinsic noise in order to maximize the sensitivity to the information signal.

The stable local oscillator present in all radio systems ideally would produce a signal just at the required operating frequency. In real stable local oscillators the power spectral density of the oscillator is distributed over a range of frequencies centered about the desired frequency at which most of the oscillator's power is located. Spectral broadening of the stable local oscillator is caused by random time varying phase perturbations termed phase noise. Phase noise in the transmitter and receiver stable local oscillator results in a reduction in the receiver sensitivity. In RADAR systems phase noise in the RADAR transceiver stable local oscillator manifests as an uncertainty in the Doppler frequency shift and consequently an uncertainty with respect to the target velocity. It is consequently advantageous in both radio communications systems and RADAR systems to reduce the phase noise contribution of the stable local oscillator.

A free running oscillator forms the basic component of a phase locked loop. The phase locked loop enables the phase stability of a free running oscillator to be corrected with respect to a stable reference oscillator. The stable reference oscillator typically operates at a frequency significantly less than that of the free running oscillator. The frequency and phase stability of a free running oscillator is determined by the resonator used in the positive feedback path of the oscillator. In order to sustain oscillation it is necessary for the positive feedback loop of the free running oscillator to exhibit more gain than loss and an overall phase shift around the loop equal to an integer multiple of 360 degrees.

It is standard practice to phase lock a free running oscillator which operates at the desired system frequency, to a fixed frequency crystal reference. The operation of phase locking the free running oscillator maintains the oscillator at a frequency determined by a multiple of the crystal reference frequency. As the temperature of the system changes the phase shift across the oscillator loop components will change resulting in a change in the operating impedance of the resonant element of the oscillator. If the oscillation frequency moves away from the resonance frequency of the resonator as a result of changes in the environmental temperature then the resonator insertion loss will increase. If there is a sufficiently large increase in temperature then the insertion loss of the resonator will exceed the feedback gain of the oscillator and the oscillations will stop.

Figure 1:
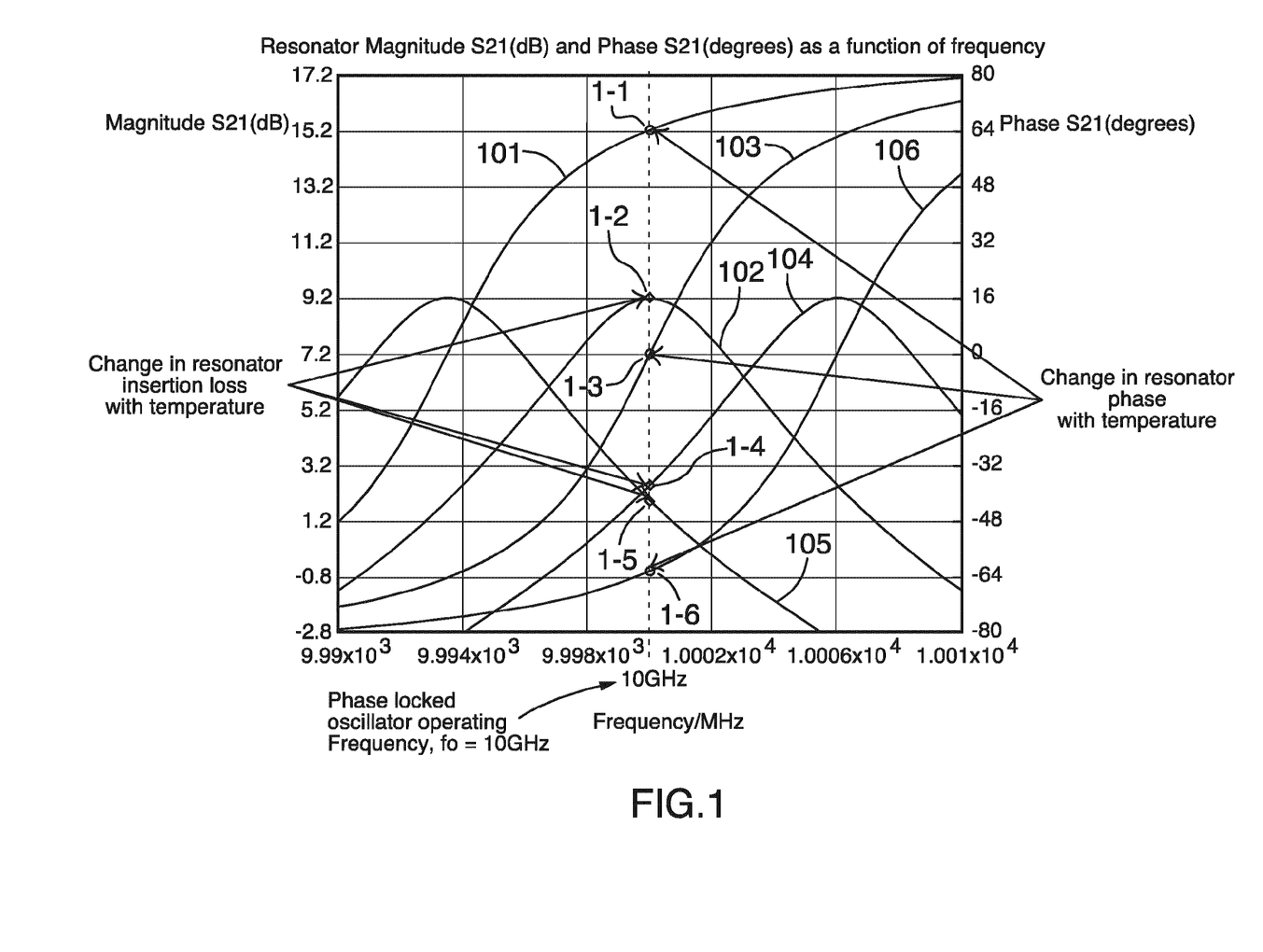
FIG. 1 is a graph illustrating several plots of resonator magnitude and phase as a function of frequency for a variety of temperatures.

The change in resonator insertion loss is illustrated in FIG. 1. FIG. 1 is graph illustrating several plots of resonator magnitude and phase as a function of frequency for a variety Pf temperatures. Plots 101, 103, and 106 illustrate resonator phase as a function frequency for temperatures negative 40° C., positive 25° C., and positive 85° C., respectively. Plots 102, 104, and 105, illustrate the resonator magnitude as a function of frequency for temperatures positive 25° C., positive 85° C., and negative 40° C., respectively. Each of points 1-1, 1-3 and 1-6 represent the resonator phase at 10 GHz. Each of points 1-2, 1-4 and 1-5 represent the resonator insertion loss at 10 GHz. Point 1-2 represents the lowest insertion loss of the resonator, as the operating temperature is Increased or decreased the insertion loss increases to that of points 1-4 and 1-5.

The rate of change in insertion loss of the resonator increases with resonator quality factor. In order to minimize the oscillator phase noise a high quality factor is required, consequently, in the case of high quality factor low noise oscillators there is a tradeoff between the phase noise and operating temperature range. Some forms of narrow band oscillators, such as dielectric resonator oscillators, require precise frequency centering of the resonator, using a mechanical tuning screw, to ensure that the oscillation condition is met over the operating temperature range. Even in the case of oscillators that employ such mechanical frequency setting the phase noise of the oscillator is degraded at the upper and lower operating temperatures because the rate of change of phase as a function of frequency offset from resonance decreases with increasing offset from the oscillator resonance frequency. Decreasing the resonator rate of change of phase increases the instantaneous frequency excursions in the oscillator loop required to compensate for random phase fluctuations in the loop components, which in turn leads to higher output phase noise levels from the oscillator. The change in resonator phase gradient is shown in FIG. 1. Point 1-3 is the point of maximum phase gradient and consequently lowest phase noise which occurs when the oscillation frequency and resonator resonance frequency are equal. As the oscillator temperature increases or decreases the phase gradient decreases as shown by points 1-1 and 1-6, the reduction in phase gradient results in an increase in the oscillator phase noise and subsequent degradation in system performance.

As mentioned certain resonators such as dielectric resonators and cavity resonator use a mechanical tuning screw for frequency centering. Such mechanical tuning screws add complexity in the manufacturing process through the requirement for a manual alignment phase. Design reliability is also impacted by the use of such screws as very small changes in the screw depth can have significant impact on the operational frequency of the oscillator. Not using a tuning screw, however, places stringent requirements on the oscillator design to meet a specific oscillation frequency. Practically, as the tolerance on the oscillation frequency is decreased the time spent in test and tune to correct for component variation introduced during manufacture increases. A way to mitigate such problems is to reduce the quality factor of the resonator to make the design less sensitive to the resonator mechanical tolerances, however, reduction in resonator quality factor results in an increase in oscillator phase noise and as such reduces the ultimate system performance achievable.

Various embodiments disclosed herein avoid the use of a mechanical adjustment or resonator quality factor reduction and provides a means by which the oscillator can be maintained at its lowest phase noise over the operational temperature range of the system. Furthermore, the approach reduces the tolerance placed on the oscillator center frequency which can reduce and even eliminate the requirement for post production tuning. The embodiments described herein are applied primarily to a phase locked dielectric resonator oscillators, however, various embodiments described herein could equally be applied to optimize the phase noise performance of any oscillator over extended temperature range operation whilst reducing the tolerance on the oscillation design center frequency to improve manufacturing yield and reduce design test and tune time.

Figure 2:
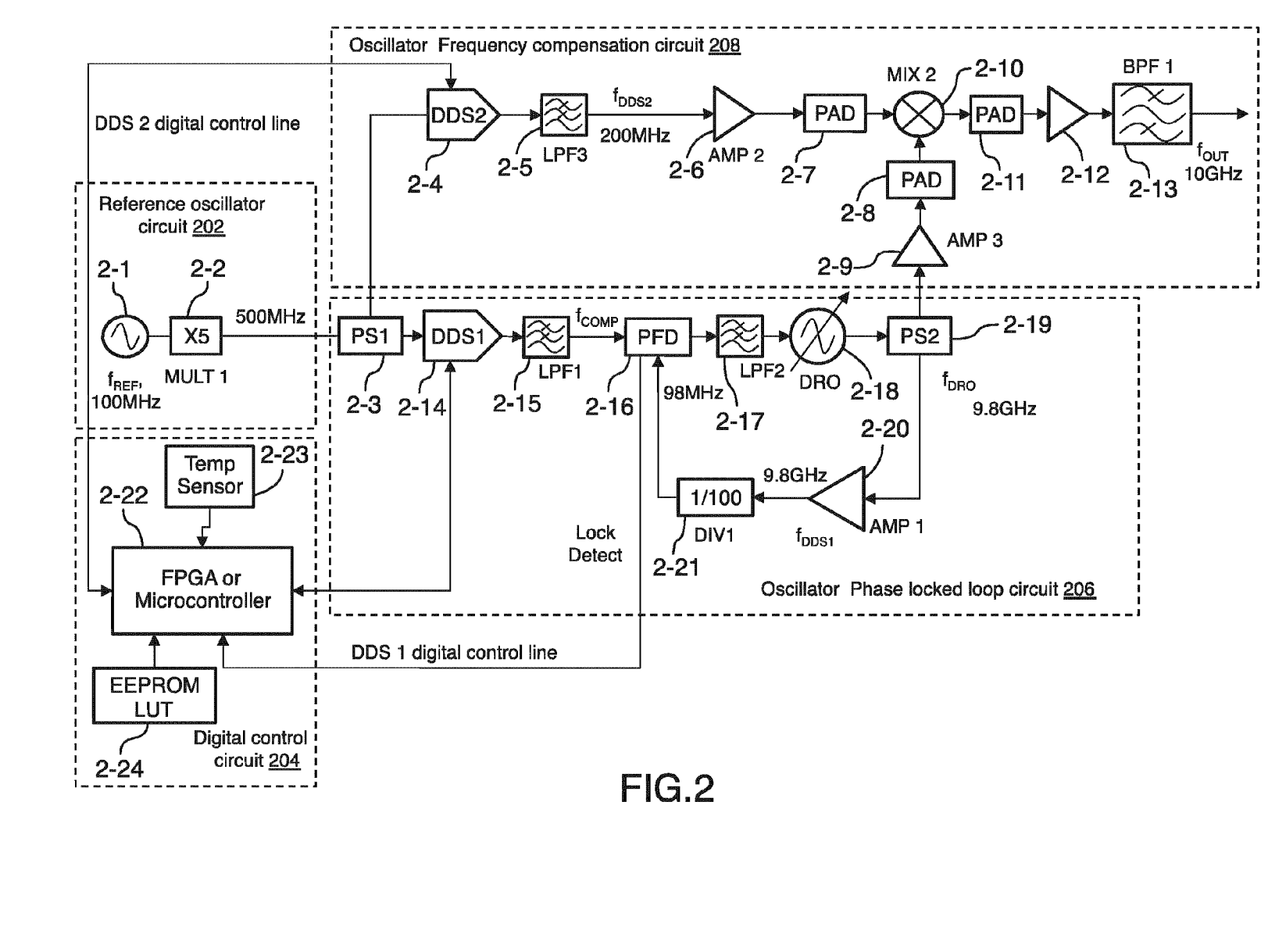
FIGS. 2, 3, 4 and 5 are block diagrams of digitally compensated phase locked oscillator circuits in accordance with first, second, third and fourth embodiments.

An embodiment of the invention is described in detail with reference to the block diagram of FIG. 2. FIG. 2 represents a general embodiment of the invention. The block diagram of FIG. 2 consists of four main sub circuits consisting of: the reference oscillator circuit 202; the digital control circuit 204; the offset phase locked loop 206 and the oscillator frequency compensation circuit 208.

The operation of the circuit is described with respect to application to a dielectric resonator oscillator, DRO, however, for those skilled in the art generalization of the approach to other oscillator technologies will be obvious based on the present disclosure. It is assumed that the DRO, 2-18, has been designed for operation at 10 GHz. The DRO is also assumed to have no mechanical frequency adjustment screw. The frequency of DDS 1, 2-14, is initially set to 95 MHz, since the actual operating frequency of the DRO is 9.8 GHz the phase frequency detector, 2-16, lock detect circuit registers a logic level low indicating an unlocked state. The FPGA, 2-22, of the digital control circuit on receiving the unlock status, records the system operating temperature using temperature sensor, 2-23, and initiates a frequency sweep of DDS 1, 2-14, from 95 MHz to 105 MHz in steps of 100 KHz. During the frequency sweep the lock detect signal will toggle from low to high and then back to low signifying a range of frequencies over which the phase locked loop is locked. The locked frequency settings and operating temperature are stored in the EEPROM, 2-24, and on completion of the sweep the central value of the locked range is calculated and programmed into DDS1, 2-14, by the digital control circuit FPGA, 2-22.

First operation of the embodiment described herein consequently establishes phase lock of the DRO based on a blind frequency search. The DDS1 output frequency is known because of the mathematical relationship it has to the reference oscillator frequency. In order for the phase locked loop to be locked the DRO frequency must be exactly equal to DDS 1 frequency multiplied by the value of the fixed frequency divider DIV 1, 2-21, present in the phase locked loop feedback path, consequently, under locked condition the DRO frequency is known. Based on the block diagram of FIG. 2 the DRO frequency would be determined to be 9.8 GHz. DDS2, 2-4, is then programmed to output 200 MHz, which when mixed with the DRO 9.8 GHz signal in mixer MIX 2, 2-10, establishes the required 10 GHz signal as the upper sideband. The band pass filter, BPF 1, 2-13, is selected to reject the lower sideband leaving the desired 10 GHz output signal.

The operational temperature of the system is monitored by the temperature sensor 2-23. In production test and calibration of the unit in accordance with various embodiments described herein would be placed in a temperature chamber and cycled over the operational temperature range. Every 20° C. the lock range scan is conducted and the center frequency of the lock range stored in the look up table located in the EEPROM, 2-24, along with the associated temperature. Once this calibration cycle has been completed the frequency of DDS 1, 2-14, can be adjusted in order to maintain the DRO, 2-18, in the center of the lock range irrespective of the operating temperature. It should be noted that the center of the lock range also represents the resonance frequency of the dielectric resonator present in the DRO, 2-18, and as such the lowest phase noise operating point for the DRO. Various embodiments disclosed herein ensure that the DRO, 2-18, is always operating in its lowest phase noise mode.

In the case that the DRO frequency is say 10.2 GHz the 200 MHz DDS 2, 2-4, frequency setting is still used, however, the lower sideband is now selected from mixer MIX 2, 2-10. Various embodiments thus enable the arbitrary DRO frequency associated with the lowest phase noise condition to be corrected to the required output frequency by mixing with the adjustable output frequency of DDS2. Low frequency operation of DDS 2 ensures that the DOS phase noise does not limit the phase noise of the output signal of the system. Use of higher frequency DDS for DDS 2 can be employed if increased rejection of the unwanted sidebands from MIX 2 is required.

Figure 3:
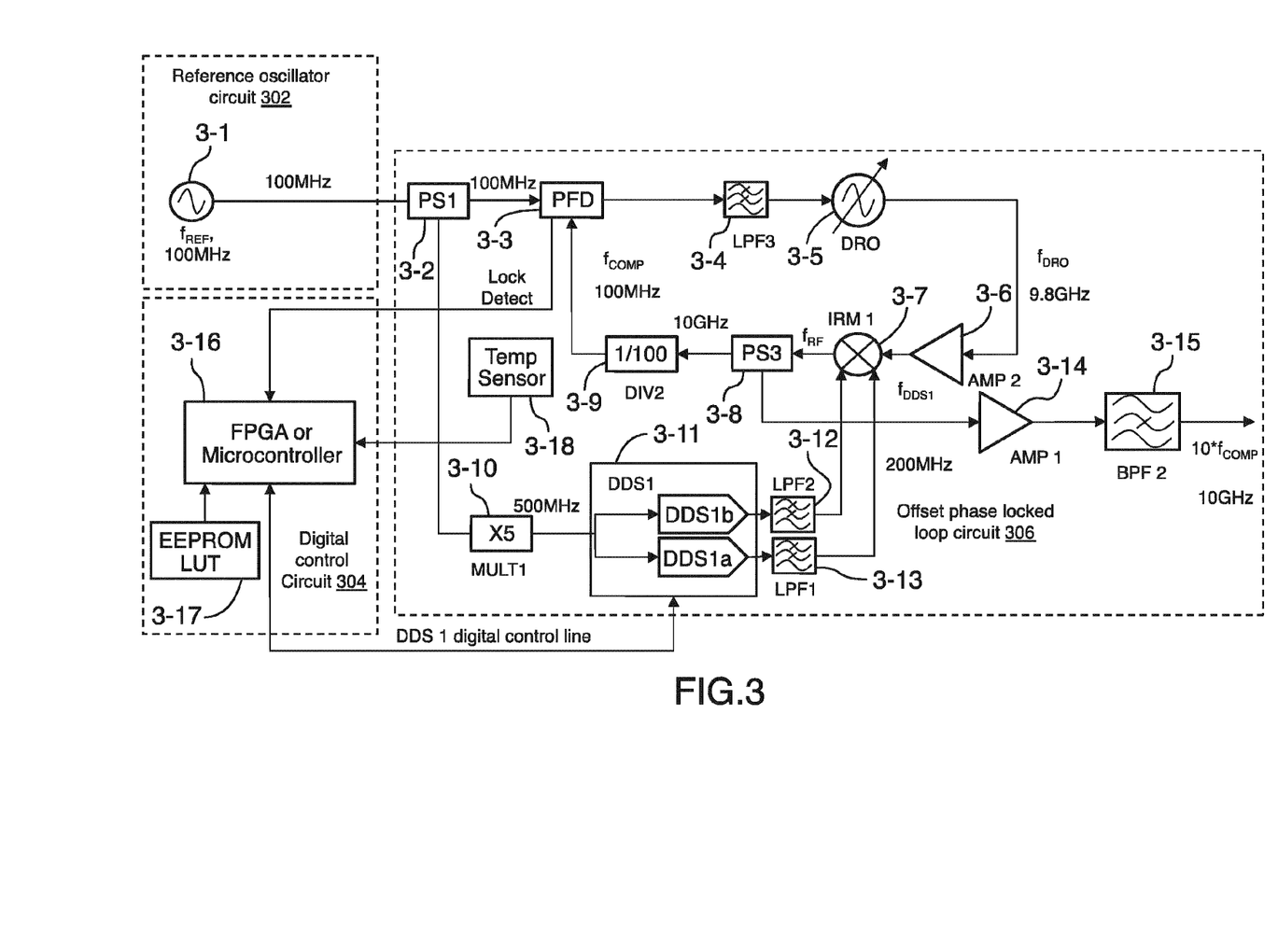
Figure 4:
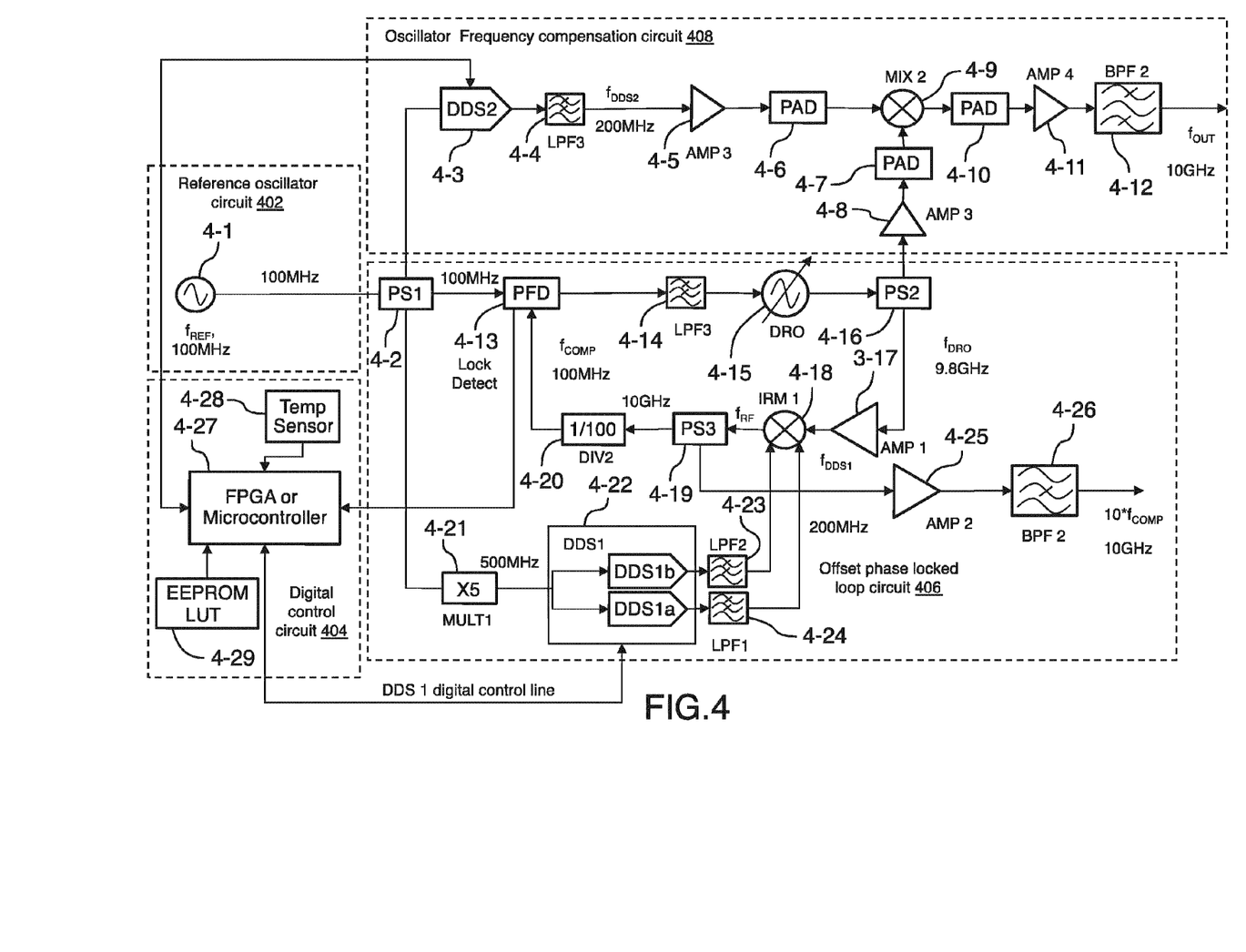

A second implementation of the embodiments disclosed herein is presented in FIG. 3. The digitally compensated phase locked oscillator circuit of FIG. 3 includes a reference oscillator circuit 302, a digital control circuit 304, and an offset phase locked loop circuit 306. In the implementation of FIG. 3 the comparison frequency, $f_{comp}$, is fixed at 100 MHz. An offset signal is mixed with the DRO signal to establish the correct conditions for phase lock of the loop. The offset signal is generated by DDS1, 3-11, which in this embodiment is a dual channel DDS capable of providing two outputs in quadrature necessary to drive the IF port of the image rejection mixer 3-7. The basic operation of the embodiments remains the same as in the case of the block diagram of FIG. 2. The operational temperature is recorded and the frequency of DDS 1 changed whilst monitoring the lock detection signal. Following the frequency sweep DDS 1 is programmed with the frequency at the center of the lock range. Under locked operation the signal output from power splitter PS 3, 3-8, has to be the comparison frequency multiplied by the divide ratio of DIV 2, 3-9. Consequently, in the embodiment of FIG. 3, an additional mixer is not required to correct to DRO phase locked frequency. The extracted frequency is equal to the comparison frequency multiplied by the division setting in DIV 2. The use of an offset phase locked loop 306 also is advantageous in that it reduces the phase noise and spurious contribution of the DDS1 to the source output FIG. 4 illustrates another embodiment of a digitally compensated phase locked oscillator, which comprises a reference oscillator circuit 402, a digital control circuit 404, an offset phase locked loop circuit 406, and an oscillator frequency compensation circuit 408. In the alternate embodiment of FIG. 4 the offset phase locked loop 406 is used as in FIG. 3 but the frequency compensation path is re-introduced. The approach is included as it provides additional flexibility in terms of frequency planning and spurious reduction. Once again the underlying principle of operation remains the same the offset loop is used to establish phase lock between the reference and the DRO at the optimal operating point of the DRO with respect to its phase noise performance and the compensation path corrects for the variability in the DRO operating frequency.

Figure 5:
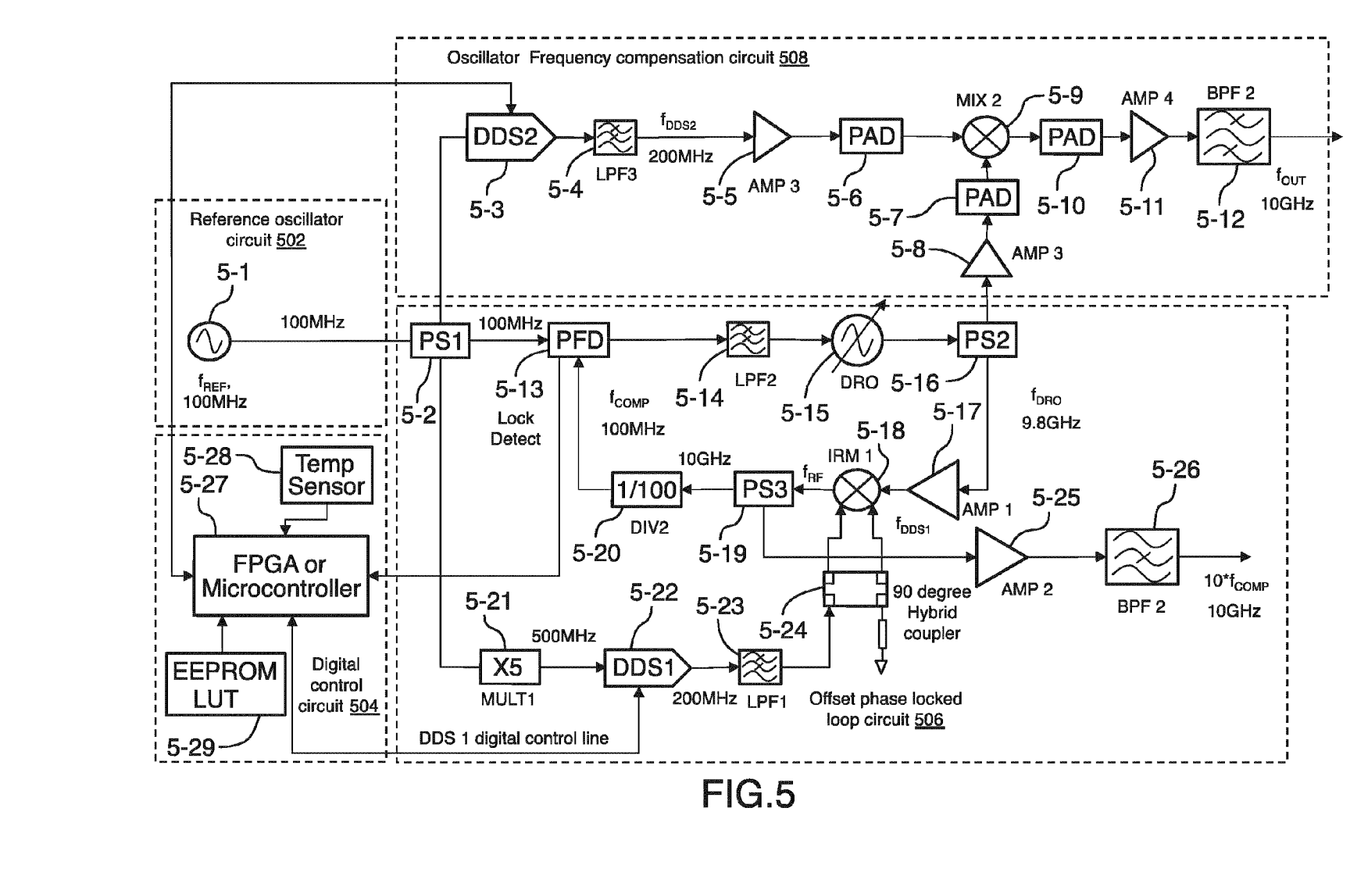

FIG. 5 illustrates another embodiment of a digitally compensated phase locked oscillator, which comprises a reference oscillator circuit 502, a digital control circuit 504, an offset phase locked loop circuit 506, and an oscillator frequency compensation circuit 508. In the implementation of FIG. 5 a hybrid power splitter has been used to create the quadrature signals required by the image rejection mixer, 5-18, this approach allows the use of a single channel DDS 1, 5-22, and could be implemented as a simplification to the embodiment of FIG. 4.

Figure 6:
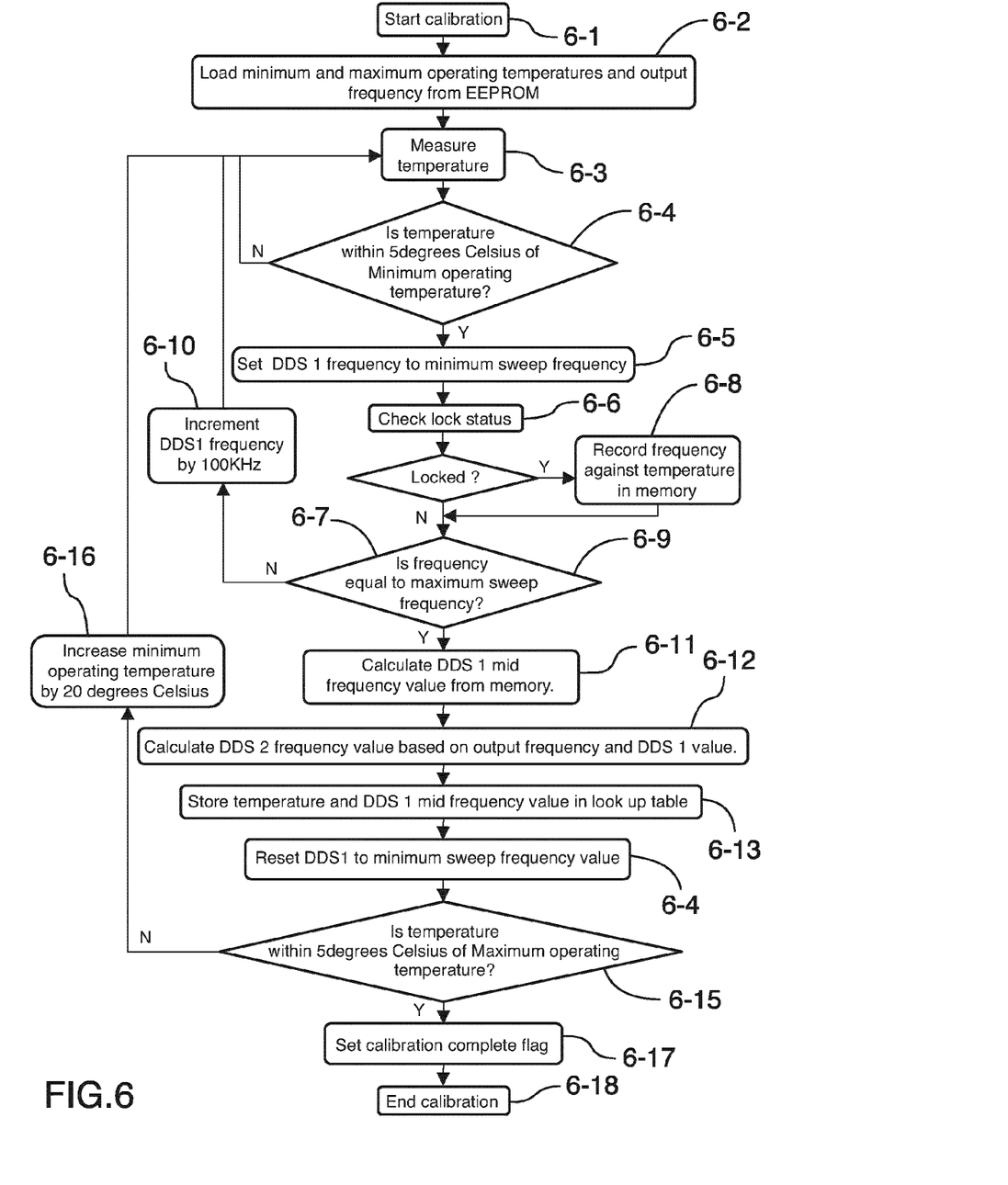
FIG. 6 is a flow chart diagram illustrating an example method of calibrating a digitally compensated phase locked DRO in accordance with the present disclosure.

In various embodiments disclosed herein the characteristics of the oscillator are determined over the operating temperature of the circuit as part of the initial circuit calibration. FIG. 6 illustrates a flow chart of an example method of calibrating a digitally compensated phase locked oscillator in accordance with the present disclosure. The method may be carried out by software executed by, for example, one or more processors. The processor can be, for example, a FPGA or a microcontroller. Programming of the processor for carrying out such a method is within the scope of a person of ordinary skill in the art given the present description. The method may contain additional or fewer processes than shown and/or described, and may be performed in a different order. In some embodiments, computer-readable code executable by at least one processor to perform the method may be stored in a computer-readable medium, such as a non-transitory computer-readable medium.

At 6-1, calibration is initiated.

At 6-2, the processor loads the minimum and maximum operating temperatures an output frequency from a memory device. The memory device can be, for example, an Electrically Erasable Programmable Read-Only Memory (EEPROM) as illustrated in FIGS. 2 to 5. In various embodiments, the processor can be, for example, a field-programmable gate array (FPGA) or a microcontroller.

At 6-3, the temperature is measured by a temperature sensor.

At 6-4, a processor determines whether the temperature is within a threshold distance from the minimum operating temperature. In some embodiments, the threshold is 5° C. If it is determined that the temperature is not within a threshold distance of the minimum operating temperature, then the temperature is measured again at 6-3.

On the other hand, if it is determined that the measured temperature is within a threshold distance of the minimum operating temperature, then the method proceeds to 6-5.

At 6-5, the processor sets the frequency of DDS 1 to the minimum sweep frequency.

At 6-6, the lock status of the PLL is checked.

At 6-7, it is determined whether the PLL is in a locked state. If the PLL is in a locked state, then the method proceeds to 6-8 followed by 6-9. If the PLL is not in a locked state, the method proceeds to 6-9 and 6-8 is omitted.

At 6-8, the DDS 1 frequency and the measured temperature are stored in the memory device. In the present disclosure, the terms "stored" and "recorded", when used in reference to a memory device, are used interchangeably.

At 6-9, it is determined whether the current DDS1 frequency is equal to the maximum sweep frequency. If the DDS 1 frequency is not at the maximum sweep frequency, then 6-10 is executed. Otherwise, the method proceeds to 6-11.

At 6-10, the DDS 1 frequency is incremented. For example, in some embodiments it is incremented by 100 kHz. After 6-10 has been executed, the method proceeds to 6-3.

At 6-11, a mid-frequency of DDS 1 is calculated based on the DDS 1 frequencies stored in memory at 6-8.

At 6-12, a frequency value for DDS 2 is calculated based on the output frequency and the DDS 1 value.

At 6-13, the measured temperature and the mid-frequency of DDS 1 is stored in memory. In various embodiments disclosed herein, these values are stored in a lookup table.

At 6-14, DDS 1 is reset to the minimum sweep frequency value.

At 6-15, the processor determines whether the temperature is within a threshold distance from the maximum operating temperature. In some embodiments, the threshold is 5° C. If it is determined that the temperature is not within a threshold distance of the maximum operating temperature, then the temperature is measured again at 6-16. On the other hand, if it is determined that the measured temperature is within a threshold distance of the maximum operating temperature, then the method proceeds to 6-17.

At 6-16, the minimum operating temperature is incremented. In some embodiments, the minimum operating temperature is increased by 20° C.

At 6-17, the calibration complete flag is set.

At 6-18, the calibration is completed.

Figure 7:
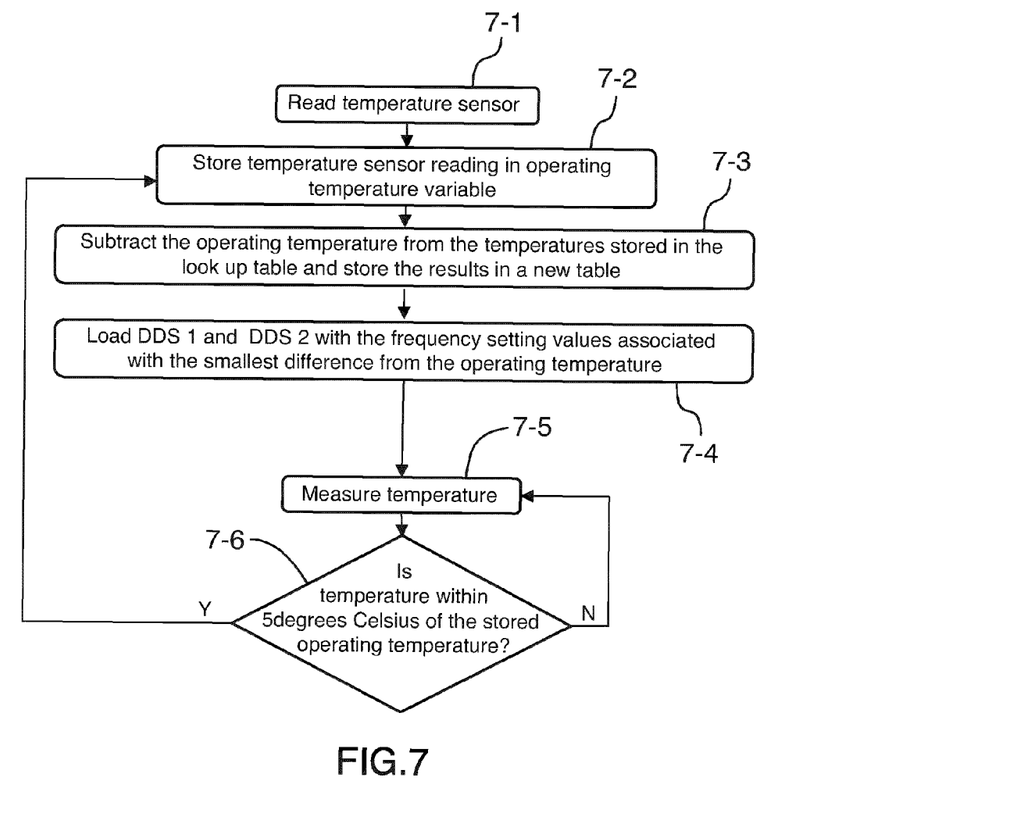
FIG. 7 is a flow chart diagram illustrating a method of setting a frequency in a digitally compensated phase locked DRO in accordance with the present disclosure.

After calibration of the unit, the frequency setting method of FIG. 7 operates to maintain optimal operation of the source over the calibration temperature range. FIG. 7 is a flow chart illustrating an example of a method of operating a system including a digitally compensated phase locked oscillator such as those illustrated in FIGS. 2 to 5 of the present disclosure. The method may be carried out by software executed by, for example, a processor. The processor can be, for example, a FPGA or a microcontroller. Programming of the processor for carrying out such a method is within the scope of a person of ordinary skill in the art given the present description. The method may contain additional or fewer processes than shown and/or described, and may be performed in a different order. In some embodiments, computer-readable code executable by at least one processor to perform the method may be stored in a computer-readable medium, such as a non-transitory computer-readable medium.

At 7-1, the temperature sensor is read.

At 7-2, the temperature sensor reading is stored in the operating temperature variable.

At 7-3, the processor identifies the temperature value stored in the lookup table that is closest to the temperature read by the temperature sensor and stored in the operating temperature variable. In some embodiments, this is achieved by subtracting the operating temperature variable from each of the values stored in the lookup table and storing the results in a new table. Then the value having the smallest magnitude in the new table is selected.

At 7-4, the DDS 1 and DDS 2 frequency setting values associated with the identified temperature are loaded from memory.

At 7-5, as the system is operated the temperature is measured.

At 7-6, the processor determines whether the measured temperature is within a threshold value of the stored operating temperature variable value. In some embodiments, the threshold corresponds to 5° C. If the measured temperature is within the threshold value the stored operating temperature, then the system continues to operate with the current DDS 1 and DDS 2 frequency settings and the temperature is measured again at 7-5. On the other hand, if the temperature measured at 7-5 is not within the threshold, then the method returns to 7-2.

In the preceding description, for purposes of explanation, numerous details are set forth in order to provide a thorough understanding of the embodiments. However, it will be apparent to one skilled in the art that these specific details are not required. In other instances, well-known electrical structures and circuits are shown in block diagram form in order not to obscure the understanding. For example, specific details are not provided as to whether the embodiments described herein are implemented as a software routine, hardware circuit, firmware, or a combination thereof.

Embodiments of the disclosure can be represented as a computer program product stored in a machine-readable medium (also referred to as a computer-readable medium, a processor-readable medium, or a computer usable medium having a computer-readable program code embodied therein). The machine-readable medium can be any suitable tangible, non-transitory medium, including magnetic, optical, or electrical storage medium including a diskette, compact disk read only memory (CD-ROM), memory device (volatile or non-volatile), or similar storage mechanism. The machine-readable medium can contain various sets of instructions, code sequences, configuration information, or other data, which, when executed, cause a processor to perform steps in a method according to an embodiment of the disclosure. Those of ordinary skill in the art will appreciate that other instructions and operations necessary to implement the described implementations can also be stored on the machine-readable medium. The instructions stored on the machine-readable medium can be executed by a processor or other suitable processing device, and can interface with circuitry to perform the described tasks.

The above-described embodiments are intended to be examples only. Alterations, modifications and variations can be effected to the particular embodiments by those of skill in the art without departing from the scope, which is defined solely by the claims appended hereto.

What is claimed is:

1. A digitally compensated phase locked oscillator (DCPLO), comprising:
    a DCPLO input for receiving a reference signal at a known frequency;
    a DCPLO output for outputting a signal at a desired frequency;
    a phased locked loop (PLL), the phased locked loop comprising:
        a phase frequency detector;
        an oscillator;
        a PLL output coupled to the DCLPO output;
    a first direct digital synthesizer (DDS), the first DDS having an output coupled to the PLL to supply a DDS signal to the PLL for adjusting a frequency within the PLL;
    a temperature sensor;
    a processor coupled to the first DDS, the phase frequency detector, and the temperature sensor; and
    a second DDS having an input coupled to the processor and having a second DDS frequency that is set based on a frequency setting of the first DDS,
    the processor configured to set the frequency of the first DDS according to a temperature sensed by the temperature sensor, and to offset the frequency of the PLL using the second DDS frequency, so as to maintain the PLL in a phase locked state and at a lowest phase noise within an operational temperature range of the DCPLO.

2. The digitally compensated phase locked oscillator of claim 1, further comprising:
    a storage medium coupled to processor, the storage medium storing a plurality of first DDS frequencies and associated temperature values;
    wherein the processor is configured to set the frequency of the first DDS by:
        determining the temperature sensed by the temperature sensor;
        identifying a temperature value stored in the storage medium closest to the sensed temperature;
        identifying a first DDS frequency stored in the storage medium associated with the identified temperature; and
        operating the first DDS at the identified frequency.

3. The digitally compensated phase locked oscillator of claim 1, further comprising :
    a frequency compensation circuit coupled to an output of the PLL, the frequency compensation circuit comprising:
        the second DDS;
        a mixer, for mixing an output of the second DDS and the output of the PLL to produce a mixed signal; and
        a bandpass filter coupled to an output of the mixer for selecting a sideband of the mixed signal;
    wherein the processor is further configured to set the frequency of the second DDS to produce a mixed signal having a desired frequency.

4. The digitally compensated phase locked oscillator of claim 1, wherein
    the phased locked loop comprises:
        an image rejection mixer coupled between the oscillator and the phase frequency detector; and
        a power splitter (PS) having an input coupled to an output of the image rejection mixer, a first PS output coupled to the phase frequency detector and a second PS output coupled to the DCPLO output;
    the first DDS comprises a dual channel DDS having two outputs in quadrature for driving an IF port of the image rejection mixer.

5. The digitally compensated phase locked oscillator of claim 4, further comprising:
    a frequency compensation circuit coupled to an output of the PLL, the frequency compensation circuit comprising:
        a second DDS having an input coupled to the processor;
        a mixer, for mixing an output of the second DDS and the output of the PLL to produce a mixed signal; and
        a bandpass filter coupled to an output of the mixer for selecting a sideband of the mixed signal;
    wherein the processor is further configured to set the frequency of the second DDS to produce a mixed signal having a desired frequency.

6. The digitally compensated phase locked oscillator of claim 3, wherein
    the phased locked loop further comprises:

an image rejection mixer coupled between the oscillator and the phase frequency detector; and a power splitter (PS) having an input coupled to an output of the image rejection mixer, a first PS output coupled to the phase frequency detector and a second PS output coupled to the DCPLO output; and wherein the DCPLO further comprises a 90 degree hybrid coupler coupled between the output of the first DDS and an IF port of the image rejection mixer.

7. A method of calibrating the digitally compensated phase locked oscillator of claim 2, the method comprising:

a. setting the temperature to a first temperature;

b. loading a minimum operating temperature, a maximum operating temperature, and an output frequency from the storage medium;

c. measuring a temperature associated with the DCPLO;

d. sweeping the frequency of the first DDS across a frequency range;

e. recording each frequency of the first DDS at which the PLL is locked against the measured temperature;

f. after completing the sweep, calculating a mid frequency of the first DDS based on each of the recorded frequencies; and g. storing the mid frequency and the recorded temperature in a look up table.

8. The method of claim 7, further comprising:

h. setting the temperature to a second temperature; and i. repeating b to g for the second temperature.

9. The method of claim 7, further comprising:

adjusting the frequency of the first DDS to the calculated mid-frequency of the first DDS.

10. The digitally compensated phase locked oscillator of claim 1 wherein the processor is configured to maintain the PLL in a phase locked state in the center of the lock range irrespective of the operating temperature.

11. The digitally compensated phase locked oscillator of claim 1 wherein the processor is configured to adjust the frequency of the first DDS to maintain the PLL in a phase locked state as the sensed temperature varies over the operational temperature range.

12. The digitally compensated phase locked oscillator of claim 1 wherein the oscillator has an oscillator frequency, and wherein the processor is configured to adjust the frequency of the first DDS to maintain the PLL in a phase locked state when the oscillator frequency is changed.

13. The digitally compensated phase locked oscillator of claim 1 wherein the processor is configured to adjust the frequency of the first DDS to maintain the PLL in a phase locked state to an optimal operating point of the oscillator.

14. The digitally compensated phase locked oscillator of claim 1 wherein the processor is configured to set the second DDS frequency based on the frequency setting of the first DDS.

15. The digitally compensated phase locked oscillator of claim 1 wherein the PLL has a PLL divide ratio, and wherein the second DDS frequency is set based on a frequency setting of the first DDS and on the PLL divide ratio.

16. The digitally compensated phase locked oscillator of claim 1 wherein the processor is configured to maintain the PLL in a phase locked state and at a lowest phase noise within an operational temperature range of the DCPLO while maintaining the DCPLO at a fixed frequency.

\* \* \* \* \*